(12) United States Patent
Karol et al.

(10) Patent No.: US 6,678,181 B2
(45) Date of Patent: Jan. 13, 2004

(54) INDUSTRIAL POWER SUPPLY MODULES

(75) Inventors: Gregory M. Karol, Norton, MA (US); James Pagella, Natick, MA (US); John Meldrum Porter, Attleboro, MA (US); Ludi Van Deurse, Norton, MA (US)

(73) Assignee: Invensys Systems, Inc., Foxboro, MA (US)

(*) Notice: Subject to any disclaimer, the term of this patent is extended or adjusted under 35 U.S.C. 154(b) by 0 days.

(21) Appl. No.: 10/345,631

(22) Filed: Jan. 16, 2003

(65) Prior Publication Data
US 2003/0128564 A1 Jul. 10, 2003

Related U.S. Application Data

(62) Division of application No. 09/930,362, filed on Aug. 15, 2001, now Pat. No. 6,535,409.
(60) Provisional application No. 60/253,156, filed on Nov. 27, 2000.

(51) Int. Cl.⁷ .............................................. H02M 7/68
(52) U.S. Cl. ...................................... 363/141; 363/142
(58) Field of Search .............................. 363/141, 142, 363/147, 144; 361/688, 690, 704, 707, 710, 715

(56) References Cited

U.S. PATENT DOCUMENTS

| | | | |
|---|---|---|---|
| 3,697,814 A | 10/1972 | Christman et al. | 361/710 |
| 4,639,834 A | 1/1987 | Mayer | 361/710 |
| 4,937,705 A | 6/1990 | Piber | 361/710 |
| 5,241,217 A * | 8/1993 | Severinsky | 307/64 |
| 5,926,373 A | 7/1999 | Stevens | 361/704 |
| 6,005,773 A | 12/1999 | Rozman et al. | 361/707 |
| 6,297,972 B1 * | 10/2001 | Chen | 363/37 |
| 6,434,005 B1 | 8/2002 | Vinciarelli et al. | 361/704 |
| 6,483,730 B2 * | 11/2002 | Johnson, Jr. | 363/123 |

* cited by examiner

Primary Examiner—Bao Q. Vu
(74) Attorney, Agent, or Firm—Myers Bigel Sibley & Sajovec

(57) ABSTRACT

An industrial power supply module includes a heatsinking structure, e.g., an extruded aluminum structure, comprising a plurality of walls joined to define a channel. first and circuit board assemblies comprising respective booster and DC/DC converter circuits are mounted to the heatsinking structure such that at least portions of the circuit board assemblies lie in the channel. First and second end caps are attached to the heatsinking structure at respective first and second ends of the channel. Environmental seals may be provided at the first and second ends of the channel. The booster circuit may be operative to produce a first DC voltage and the DC/DC converter circuit may be operative to produce a second DC voltage from the first DC voltage such that the second DC voltage is at least about ten times less than the first DC voltage.

9 Claims, 7 Drawing Sheets

INDUSTRIAL POWER SUPPLY MODULES

RELATED APPLICATION

This is a division of application Ser. No. 09/930,362 filed Aug. 15, 2001 now U.S. Pat. No. 6,535,409. The present application claims the benefit of U.S. Provisional Patent Application Serial No. 60/253,156, filed Nov. 27, 2000, which is incorporated herein by reference in its entirety.

BACKGROUND OF THE INVENTION

The present invention relates to power supplies, and more particularly, to power supplies for industrial and other harsh environments.

Industrial control applications, such as process control applications, often involve the use of distributed controllers, transducers and other devices. Many of these devices use low voltage DC power, e.g., 24 VDC power. Accordingly, in process control applications, such as those in a refinery or petrochemical plant, AC-powered, DC-output power supplies are often located near control equipment to provide low voltage DC power.

Many conventional process control systems use off-the-shelf DC power supplies. Although these supplies may be "ruggedized" to withstand high temperature and vibration levels, they may use open-frame designs with fan-forced cooling. Such open-frame designs may be vulnerable to damage in corrosive environments, and may be unacceptable for use in explosive environments. In addition, fan-cooled units may be vulnerable to fan failure or clogging due to accumulation of dust or other contaminants. Conventional power supply units may also exhibit less than desirable efficiency, which can, in turn, yield to more thermal stress and reduced reliability.

SUMMARY OF THE INVENTION

According to embodiments of the invention, an industrial power supply module includes a heatsinking structure, e.g., an extruded aluminum structure, including a plurality of walls joined to define a channel. A first circuit board assembly includes a booster circuit operative to receive an input voltage at an input port thereof and to produce a first DC voltage therefrom, and is mounted to the heatsinking structure such that at least a portion of the first circuit board assembly lies in the channel. A second circuit board assembly includes a DC/DC converter circuit electrically coupled to the booster circuit and operative to produce a second DC voltage at an output thereof from the first DC voltage produced by the booster circuit, and is mounted to the heatsinking structure such that at least a portion of the second circuit board assembly lies in the channel. First and second end caps are attached to the heatsinking structure at respective first and second ends of the channel, the first and second end caps and the walls of the heatsinking structure enclosing a volume including at least portions of the first and second circuit board assemblies therein.

The first circuit board assembly may be mounted to the heatsinking structure such that a surface of the first circuit board assembly conforms to the plurality of walls of the heatsinking structure at the first end of the channel to define a second enclosed volume within the first enclosed volume. The second circuit board assembly may be contained within the second enclosed volume. A first gasket may provide an environmental seal between the first circuit board assembly and the heatsinking structure at the first end of the channel, and a second gasket may provide an environmental seal between the second end cap and the heatsinking structure at the second end of the channel. In this manner, the second enclosed volume may be environmentally sealed. The module may further include a third circuit board assembly attached to the heatsinking structure outside of the sealed second enclosed volume. The third circuit board assembly may include a plurality of terminals that are electrically coupled to a portion of the first circuit board assembly extending outside of the sealed second enclosed volume.

According to other aspects of the invention, at least one of the first and second circuit board assemblies includes at least one electronic component disposed near a periphery of a corresponding at least one of the first and second circuit boards. The power supply module further includes a thermally conductive region that provides heat transfer between the at least one electronic component and an adjacent wall of the heatsinking structure. For example, the at least one heat-generating component may be a power transistor, and the thermally conductive region may be a ceramic insulator disposed between the power transistor and the adjacent wall of the heatsinking structure. The adjacent wall of the heatsinking structure may have a groove defined therein, and the power supply module may further include a retaining clip that engages the groove and compresses the transistor and the ceramic insulator against the adjacent wall of the heatsinking structure.

According to yet other aspects of the invention, an industrial power supply module includes a booster circuit operative to produce a first DC voltage at an output port thereof from either of an AC input voltage or a DC input voltage at an input port thereof. The module further includes a DC/DC converter circuit electrically coupled to the booster circuit and operative to produce a second DC voltage at an output port thereof from the first DC voltage such that the second DC is at least about ten times less than the first DC voltage. An enclosure encloses portions of the booster circuit and the DC/DC converter circuit within an environmentally sealed volume. The enclosure is thermally coupled to the booster circuit and the DC/DC converter circuit to provide heat transfer between the booster and DC/DC converter circuits and an external environment. The input port of the booster circuit and the output port of the DC/DC converter circuit are electrically accessible from outside of the sealed volume. The booster circuit may be operative to correct power factor at the input port.

DETAILED DESCRIPTION

Figure 1:
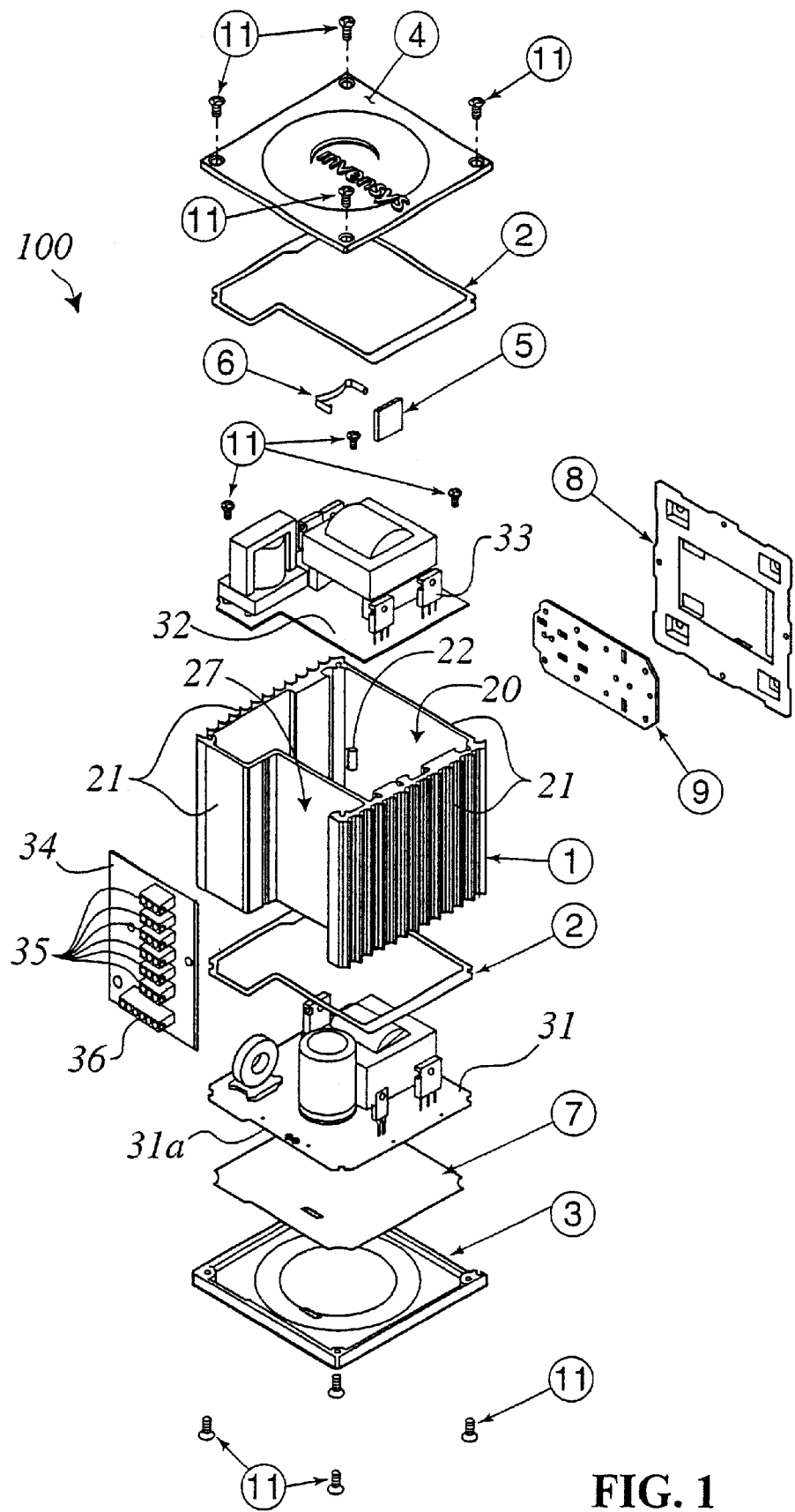
FIG. 1 is an exploded view of an industrial power supply module according to embodiments of the invention.

The invention now will be described more fully with reference to the accompanying drawings, in which specific embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements.

FIG. 1 is an exploded view of an industrial power supply module 100 according to embodiments of the invention. The module 100 includes a heatsinking structure 1 including a plurality of walls 21 that join to define a channel 20. Booster circuit and DC/DC converter circuit board assemblies 31, 32 are configured to be mounted such that they lie transverse to the channel 20 and portions of the circuit board assemblies lie in the channel 20. First and second end caps 3, 4 are configured to mate with the heatsinking structure 1 at respective ends of the channel 20, thus enclosing a volume defined by the end caps 3, 4 and the walls 21 of the heatsinking structure 1.

Portions of the boost circuit board assembly 31 and the DC/DC converter circuit board assembly 32 are contained within this enclosed volume. In particular, the booster circuit board assembly 31 is configured to be attached to the heatsinking structure 1 at a first end thereof by way of screws 11 or other fasteners that also secure the first end cap 3 to the heatsinking structure 1. The DC/DC converter circuit board assembly 32 is configured to attach to the heatsinking structure at a plurality of screw bosses 22 and screws 10, such that the DC/DC converter circuit board assembly 32 is disposed within the channel 20. Additional screws 11 secure the second end cap 4 to the heatsinking structure 1. First and second gaskets 2 seal the respective interfaces between the boost circuit board assembly 31 and the heatsinking structure 1, and between the second end cap 4 and the heatsinking structure, such that a sealed volume bordered by the walls 21 of the heatsinking structure 1, the boost circuit board assembly 31 and the second end cap 4 is provided. The sealed volume contains portions of the circuit board assemblies 31, 32. The volume enclosed by the heatsinking structure 1 and the end caps 3, 4 may be filled with alumina, silica or other inert material to adapt the module 100 for use in, for example, explosive environments. It will be appreciated that although gaskets 2 are illustrated in FIG. 1, other techniques, such as the application of silicone or other sealants, may be used to provide a seal.

One or more electronic components of the circuit board assemblies 31, 32, here a power transistor 33, is thermally coupled to an adjacent wall 21 of the heatsinking structure 1 via a ceramic insulator 5 that compressively attaches the power transistor 33 to the wall 21 of the heatsinking structure. The module 100 also includes a Nomex® insulator 7 that provides electrical isolation between the boost circuit board assembly 31 and the first end cap 3. The module 100 further includes a DIN (Deutsche Industrie-Norm) rail mounting adaptor 9 and a mounting plate 8 that are attached to the heatsinking structure 1. The DIN rail-mounting adaptor 9 provides means for attaching the power supply module to an industry-standard DIN mounting rail, while the mounting plate provides means for mounting the module 100 in, for example, an industrial equipment rack. It will be appreciate that other attachment structures may be used with the invention including.

The module 100 further includes a connection circuit board assembly 34 configured to mount in a second, open channel 27, defined by the walls 21 of the heatsinking structure 1 and disposed generally parallel to the other channel 20. The connection circuit board assembly 34 includes a plurality of terminals, including input terminals 35 for receiving either an AC or DC input voltage that is applied to an input port of a boost circuit of the boost circuit board assembly 31. Output terminals 36, coupled to an output port of a DC/DC converter circuit of the DC/DC converter circuit board assembly 32, provide a DC voltage produced by the DC/DC converter circuit board assembly to an externally connected load (not shown). It will be appreciated that the terminals 35, 36 may include screw-type terminals, compression terminals, connector pins/sockets, or other types of electrical connection means.

The booster circuit board assembly 31 includes a portion 31a that is configured to extend outside of the sealed volume defined by the boost circuit board assembly 31, the heatsinking structure, the second end cap 3 and the gaskets 2, wherein is provided terminals, e.g., screw terminals, connector pin/sockets, or solder junctions for running wires or other conductors between the booster circuit board assembly 31 and the connection circuit board assembly 34. It will be appreciated that other structures for providing external connection to the booster circuit board assembly 31 and or the DC/DC converter circuit board assembly 32 may be used with the invention, such as pigtails and/or connectors that attach to the booster circuit board assembly 31.

Figure 2:
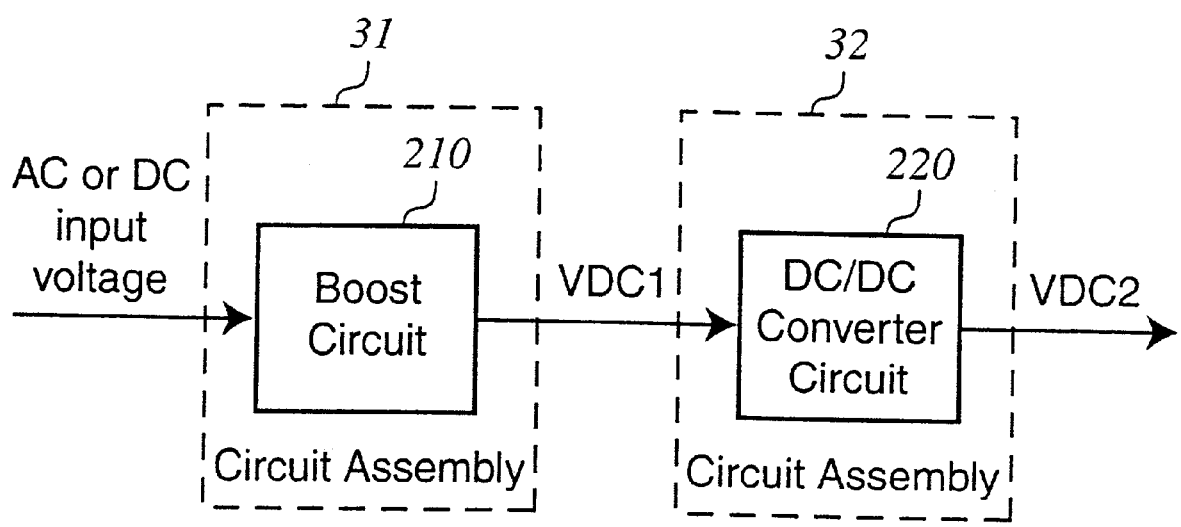
FIG. 2 is a block diagram illustrating power supply circuitry according to embodiments of the invention.

FIG. 2 is a block diagram illustrating how circuit functionality may be distributed among the boost and DC/DC converter circuit board assemblies 31, 32 illustrated in FIG. 1. In particular, the booster circuit board assembly 31 includes a booster circuit 210 that is configured to receive either of an AC input voltage or a DC input voltage, and is operative to produce a first DC voltage VDC1 therefrom. The DC/DC converter circuit board assembly 32 includes a DC/DC converter circuit 220 that is operative to produce a second DC voltage VDC2 from the DC voltage VDC1 produced by the boost circuit 210.

Figure 3:
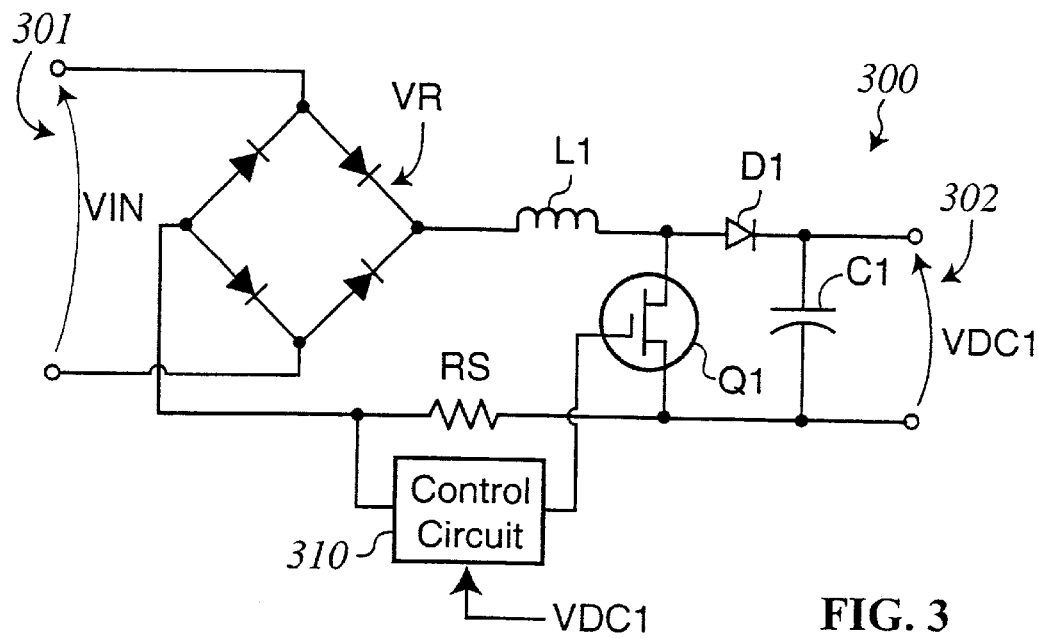
FIG. 3 is a schematic diagram illustrating a boost circuit according to embodiments of the invention.

As shown in FIG. 3, the boost circuit 210 may include a continuous current mode controlled boost converter circuit 300 that provides a power factor correction capability. In particular, the current mode controlled boost converter circuit 300 includes a full-wave bridge rectifier circuit VR that has its input coupled to an input port 301 configured to receive an AC or DC input voltage VIN. A terminal of the output of the rectifier circuit VR is coupled to the output port 302 of the circuit 300 via a boost inductor L1 and a diode D1. A transistor Q1 is coupled between the inductor L1 and another terminal of the output of the rectifier circuit VR. The transistor Q1 is controlled by a control circuit 310 responsive to the output voltage VDC1 produced at the output port 302 and to a current sensed by a current sense resistor RS. The control circuit 310 may include a power factor correcting controller chip such as the UC2852 High Power-Factor Preregulator Chip, as described in a data sheet entitled "High Power-Factor Preregulator," published by Unitrode Corporation (1997).

The input rectifier circuit VR is operative to convert alternating current (AC) to direct current (DC). The transistor Q1 is used as an electronic switch, and is cycled "on" (conducting) and "off" by the control circuit 310. While the transistor Q1 "on", the boost inductor L1 current increases. When the transistor Q1 is turned "off", the boost inductor L1 delivers current to the capacitor C1 through the diode D1. Current in the boost inductor L1 typically does not fall to zero during each switching cycle, which is why the circuit is referred to a operating in a "continuous current mode."

The transistor Q1 may be pulse-width-modulated so that the input impedance of the boost converter circuit 300 appears substantially purely resistive, and the ratio of peak to average input current may be kept low. A potentially cost-effective way of reducing losses in the circuit is by choosing a suitable diode D1 for the application. Diodes for use in power factor correction circuits typically have higher forward voltages than conventional ultrafast epitaxial diodes, but much shorter (faster) reverse recovery times. Typically, a substantially constant 380 VDC is produced at the output port 302 by using a switching frequency of about 100 Khz. As shown, the control circuit 310 may also provide over current detection and control using a sense resistor RS (or other current sensing element) coupled to the transistor Q1 and the control circuit 310. For example, if current in the transistor Q1 exceeds a predetermined peak value, the control circuit 310 may shut down the transistor Q1 for one or more pulse cycles to reduce or prevent damage.

Figure 4:
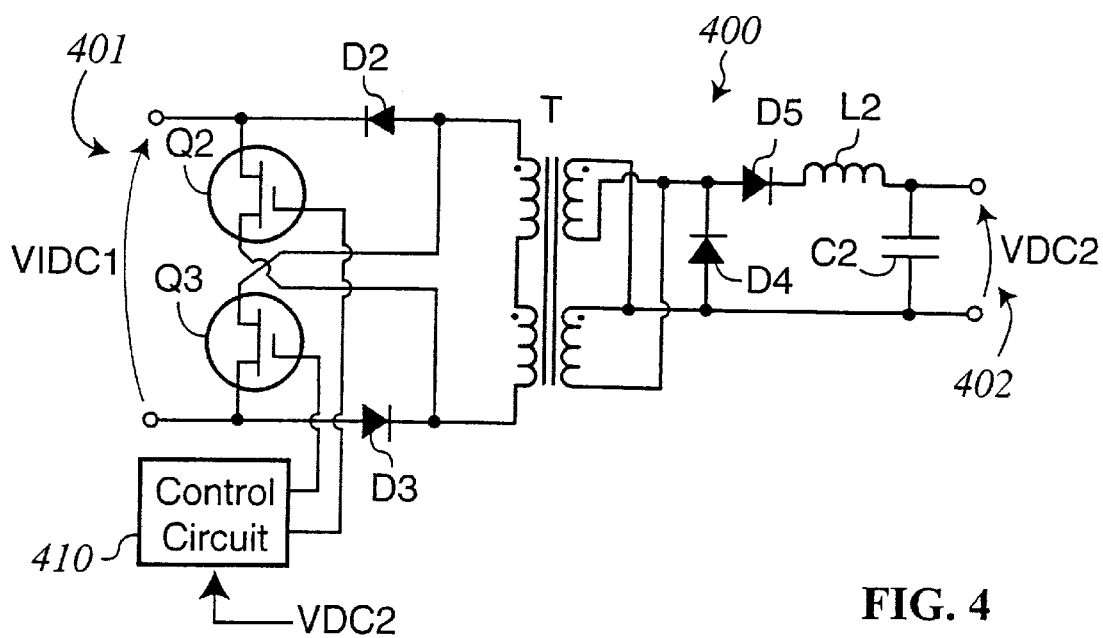
FIG. 4 is a schematic diagram illustrating a DC/DC converter circuit according to embodiments of the invention.

As shown in FIG. 4, the DC/DC converter circuit may include a two-transistor forward converter circuit 400. The forward converter circuit 400 includes a pulse transformer T having a primary winding coupled to an input port 401 by first and second transistors Q2, Q3 and diodes D2, D3. A secondary winding of the pulse transformer T is coupled to an output inductor L2 by diodes D4, D5. The output inductor L2 is coupled to a capacitor C2 that is coupled across the output port 402 of the converter circuit 400.

A control circuit 410 controls operations of the transistors Q2, Q3 responsive to the output voltage VDC2 at the output port 402. The control circuit 410 may include, for example, a UC 2845 Current Mode PWM Controller as described in a data sheet entitled "UC 1842/3/4/5 Current Mode PWM Controller," published by Unitrode Corporation (1997). The two transistors Q2, Q3 may be used to push/pull either side of primary of the transformer. In particular, the transistors Q2, Q3 may be driven by the control circuit 410 with a current mode controlled variable duty cycle. The control circuit 410 may also provide overcurrent detection and control using a current transformer coupled to the transistors Q2, Q3.

Referring now to FIGS. 2–4, according to some embodiments of the invention, the DC voltage VDC1 produced by the boost circuit 210 is about at least about ten times greater than the DC voltage VDC2 produced by the DC/DC converter circuit 220. For example, in some embodiments of the invention, the boost circuit 210 may be operative to produce about 380 VDC from an AC input voltage in a range from about 85 VAC to about 264 VAC, or from a DC input voltage in a range from about 108 VDC to about 145 VDC. The DC/DC converter circuit 220 may be operative to produce about 24 VDC at its output from the about 380 VDC.

The high output voltage boost circuit 300 of FIG. 3 may provide several advantages when used as an input stage for a power supply module, such as the power supply module 100 of FIG. 1. As noted above, the boost circuit 300 may be operative to provide power factor correction at its input port 301, thus providing the module with the capability to meet regulatory and other requirements. The boost circuit 300 may also operate off a range of AC or DC power supply voltages, thus making a module using the input boost circuit 300 useful in countries with different power supply characteristics. In addition, the generation of a relatively high DC voltage output by the boost circuit 300 as an input to a downstream DC/DC converter of the module, such as the DC/DC converter 400 of FIG. 2, can reduce resistive losses and allow the module to operate with relatively high (90% or greater) efficiency in comparison to conventional designs. Sealing of the module, as described above with reference to FIG. 1, and isolation provided by the design of the boost circuit 300 and the DC/DC converter circuit 400, can reduce danger arising from the presence of high voltage.

Figure 5:
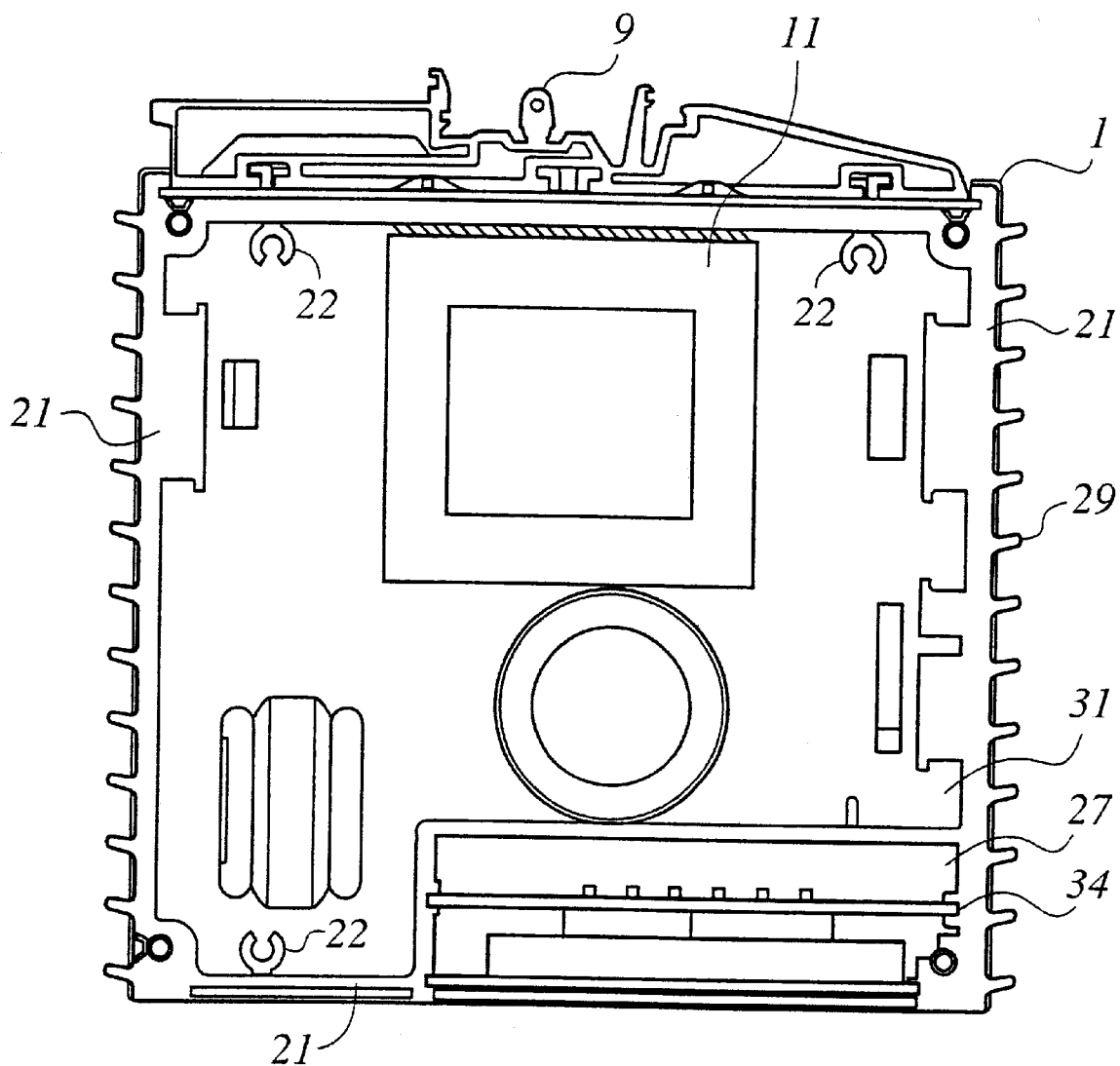
FIG. 5 is a top view illustrating mounting of a boost circuit board assembly in a power supply module according to embodiments of the invention.
Figure 6:
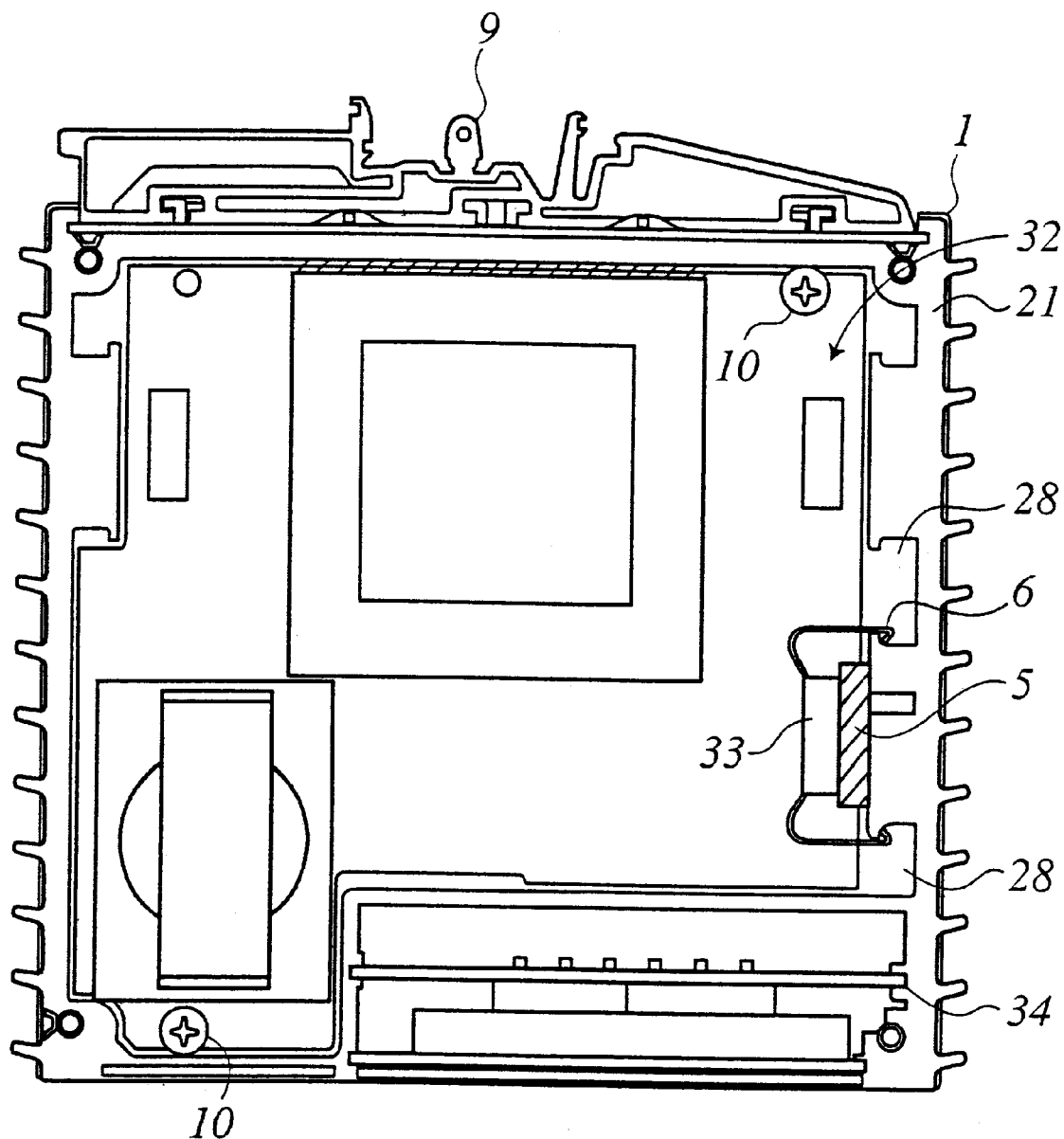
FIG. 6 is a top view illustrating mounting of a DC/DC converter circuit board assembly in a power supply module according to embodiments of the invention.

FIG. 5 is a top view of the power supply module 100 of FIG. 1, with the second end cap 4 and the DC/DC converter circuit board assembly 32 removed, such that the booster circuit board assembly 31 is visible. In this view, cooling fins 29 provided on the heatsinking extruded structure 1 are visible. FIG. 6 is a top view of the power supply module 100 of FIG. 1, with the DC/DC converter circuit board assembly 32 in place. This view illustrates that the heatsinking extruded structure 1 has parallel grooves 28 formed in a wall 21 thereof. A power transistor 33 (e.g., one of the transistors Q2, Q3 illustrated in FIG. 4) is thermally coupled to the wall 21 by a ceramic insulator 5. To improve heat transfer, a retaining clip 6 engages the grooves 28 and compresses the transistor 33 and the ceramic insulator 5 against the wall 21. It will be appreciated that other techniques for providing heat transfer from the boost circuit board assembly 31 and/or the DC/DC converter circuit board assembly 32 to the heatsinking structure may be used with the invention, including on-board heatsinks adapted to be thermally coupled to the heatsinking structure 1 using screws or other fasteners.

Figure 7:
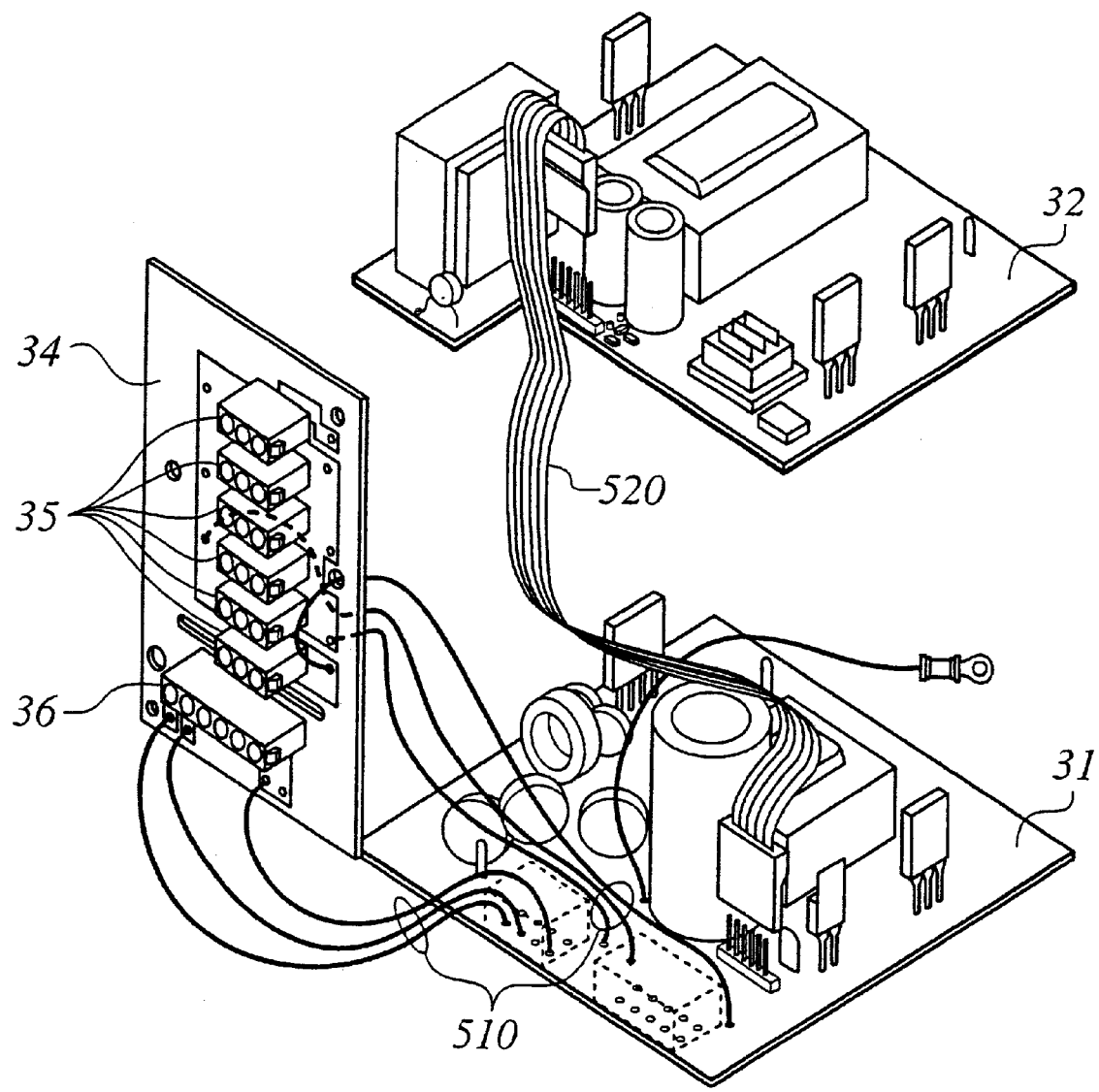
FIG. 7 is a perspective view illustrating interconnections between circuit board assemblies of a power supply module according to embodiments of the invention.

FIG. 7 illustrates exemplary interconnections between the circuit board assemblies 31, 32, 34 of FIG. 1. In particular, wires 510 couple the input terminals 35 and the output terminals 36 on the connection circuit board assembly 34 to the boost circuit board assembly 31. A wiring harness 520 couples the boost circuit board assembly 31 to the DC/DC converter assembly 32. The wiring harness 520 may include wires that provide through-coupling between the output terminals 36 and the output of the DC/DC converter circuit of the DC/DC converter circuit board assembly 32 via the boost circuit board assembly 31, as well as wires that couple the output of the boost circuit of the boost circuit board assembly 31 and the input of the DC/DC converter circuit of the DC/DC converter circuit board assembly 32.

Figure 8:
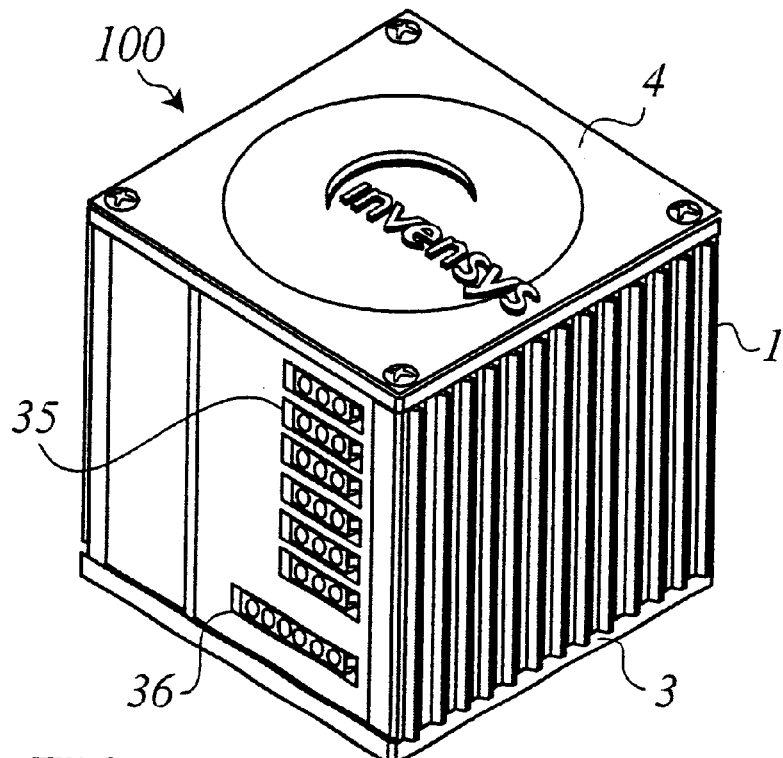
FIGS. 8 and 9 are front and rear perspective views of a power supply module according to embodiments of the invention.
Figure 9:
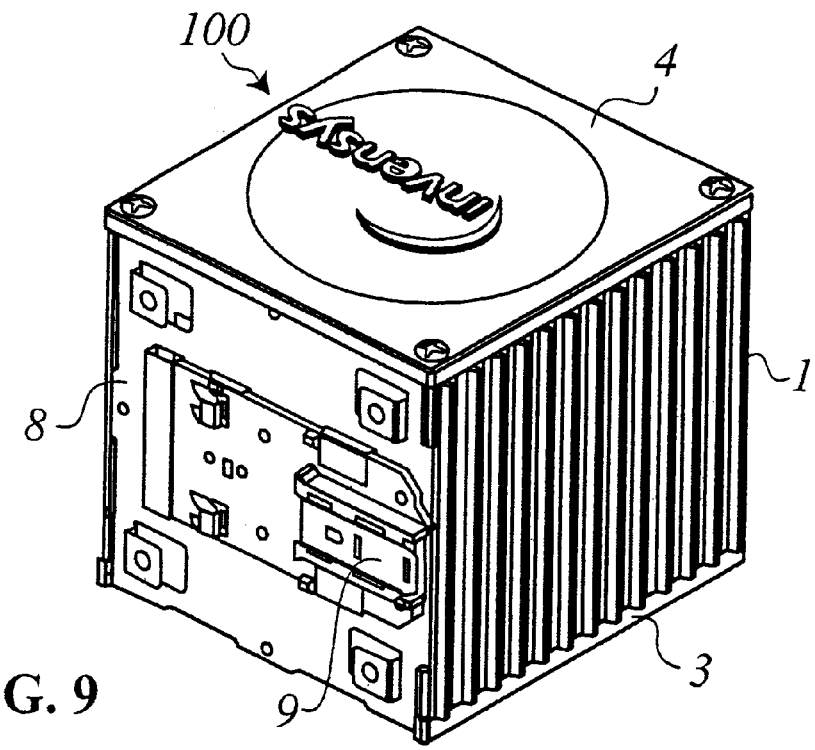

FIGS. 8 and 9 provide front and rear perspective views, respectively, of the power supply module 100 in an assembled condition. In particular, FIG. 8 illustrates arrangement of the input and output terminals 35, 36, while FIG. 9 illustrates arrangement of the DIN adaptor 9 and mounting plate 8.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. An industrial power supply module, comprising:
   a booster circuit operative to produce a first DC voltage at an output port thereof from either of an AC input voltage or a DC input voltage at an input port thereof;
   a DC/DC converter circuit electrically coupled to the booster circuit and operative to produce a second DC voltage at an output port thereof from the first DC voltage such that the second DC voltage is at least about ten times less than the first DC voltage; and
   an enclosure that encloses portions of the booster circuit and the DC/DC converter circuit within an environmentally sealed volume, wherein the enclosure is thermally coupled to the booster circuit and the DC/DC converter circuit to provide heat transfer between the booster and DC/DC converter circuits and an external environment, and wherein the input port of the booster circuit and the output port of the DC/DC converter circuit are electrically accessible from outside of the sealed volume.

2. A power supply module according to claim 1, wherein the booster circuit is operative to correct power factor at the AC input port.

3. A power supply module according to claim 1, wherein the booster circuit is operative to produce about 380 VDC from an AC voltage at the input port that is in a range from about 85 VAC to about 264 VAC.

4. A power supply module according to claim 3, wherein the DC/DC converter circuit is operative to produce about 24 VDC at its output port from the about 380 VDC produced by the booster circuit.

5. A power supply module according to claim 1, wherein the booster circuit is operative to produce about 380 VDC from a DC voltage at the input port that is in a range from about 108 VDC to about 145VDC.

6. A power supply module according to claim 5, wherein the DC/DC converter circuit is operative to produce about DC voltage of about 24 VDC at its output port from the about 380 VDC produced by the booster circuit.

7. A power supply module according to claim 1, wherein the booster circuit comprises a continuous mode boost converter circuit.

8. A power supply module according to claim 7, wherein the DC/DC converter circuit comprises a forward converter circuit.

9. A power supply module according to claim 1:
   wherein the enclosure comprises:
      a heatsinking structure comprising a plurality of walls joined to define a channel; and
      first and second end caps attached to the heatsinking structure at respective first and second ends of the channel, the first and second end caps conforming to edges of the plurality of walls of the heatsinking structure such that the heatsinking structure and the first and second end caps enclose a volume;
   wherein the power supply module further comprises first and second circuit board assemblies including respective ones of the booster circuit and the DC/DC converter circuit, the first and second circuit board assemblies mounted to the heatsinking structure such that at least portions of the booster circuit and the DC/DC converter circuit are disposed within the enclosed volume; and
   wherein an electronic component of each of at least one of the booster circuit and the DC/DC converter circuit is thermally coupled to at least one wall of the heatsinking structure.

* * * * *